(12) United States Patent
Hsu (10) Patent No.: US 9,673,425 B1
(45) Date of Patent: Jun. 6, 2017

(54) METHOD FOR MANUFACTURING AMOLED BACKPLANE AND STRUCTURE THEREOF

(71) Applicant: Shenzhen China Star Optoelectronics Technology Co., Ltd., Shenzhen (CN)

(72) Inventor: Yuanjun Hsu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 203 days.

(21) Appl. No.: 14/762,800

(22) PCT Filed: May 22, 2015

(86) PCT No.: PCT/CN2015/079535
§ 371 (c)(1),
(2) Date: Jul. 22, 2015

(87) PCT Pub. No.: WO2016/176879
PCT Pub. Date: Nov. 10, 2016

(30) Foreign Application Priority Data

May 4, 2015 (CN) .......................... 2015 1 0221192

(51) Int. Cl.
*H01L 27/32* (2006.01)
*H01L 51/56* (2006.01)
*H01L 51/52* (2006.01)

(52) U.S. Cl.
CPC .......... *H01L 51/56* (2013.01); *H01L 27/3262* (2013.01); *H01L 27/3265* (2013.01); *H01L 51/5203* (2013.01)

(58) Field of Classification Search
None
See application file for complete search history.

(56) References Cited

U.S. PATENT DOCUMENTS

| | | | | |
|---|---|---|---|---|
| 8,576,217 | B2* | 11/2013 | Chaji | G09G 3/3258 345/212 |
| 9,324,268 | B2* | 4/2016 | Soni | G09G 3/3233 |
| 9,336,717 | B2* | 5/2016 | Chaji | G09G 3/3233 |
| 9,530,349 | B2* | 12/2016 | Chaji | G09G 3/3233 |
| 2004/0087066 | A1* | 5/2004 | Voutsas | G11C 13/0007 438/147 |
| 2010/0271349 | A1* | 10/2010 | Liu | G09G 3/3225 345/205 |
| 2011/0221720 | A1* | 9/2011 | Kuo | H01L 27/3269 345/206 |
| 2015/0279913 | A1* | 10/2015 | Gates | H01L 27/3248 257/40 |
| 2016/0218124 | A1* | 7/2016 | Wang | H01L 27/124 |
| 2016/0343828 | A1* | 11/2016 | Hsu | H01L 27/32 |

* cited by examiner

*Primary Examiner* — Michael Lebentritt
(74) *Attorney, Agent, or Firm* — Leong C. Lei (57) ABSTRACT

The present invention provides a method for manufacturing an AMOLED backplane and a structure thereof. The method uses a solid phase crystallization process to crystallize and convert amorphous silicon into poly-silicon so as to prevent the issue of mura on a display device caused by excimer laser annealing and adopts a back channel etching structure to effectively reduce the number of masks used. The method for manufacturing the AMOLED backplane according to the present invention needs only seven masking operations and, compared to the prior art, saves two masking operations, thereby simplifying the manufacturing process, improving the manufacturing efficiency, and saving costs.

11 Claims, 7 Drawing Sheets

METHOD FOR MANUFACTURING AMOLED BACKPLANE AND STRUCTURE THEREOF

BACKGROUND OF THE INVENTION

1. Field of the Invention

The present invention relates to the field of display technology, and in particular to a method for manufacturing an active matrix organic light emitting diode (AMOLED) backplane and a structure thereof.

2. The Related Arts

In the field of display technology, the flat panel display technology, including liquid crystal display (LCD) and organic light emitting diode (OLED), has gradually taken the place of cathode ray tube (CRT) displays. Among them, OLED has various advantages, including self-luminous, low drive voltage, high emission efficiency, short response time, high sharpness and contrast, approximately 180 degree view angle, wide range of operation temperature, and being capable of achieving flexible displaying and large-area full-color displaying, and is widely used in for example mobile phone screens, computer displays, and full-color televisions and are considered a display device of the most prosperous development.

According to the types of driving, OLEDs can be classified as passive OLEDs (such as PMIOLEDs) and active OLEDs (such as AMOLEDs). An AMOLDE is a self-luminous device composed of a low temperature poly-silicon (LTPS) driving backplane and an electroluminescent layer. The LTPS possesses relatively high electron mobility and for an AMOLED, which involves the LTPS material, various advantages, such as high resolution, high response speed, high brightness, high aperture ratio, and low power consumption, can be achieved.

Figure 1:
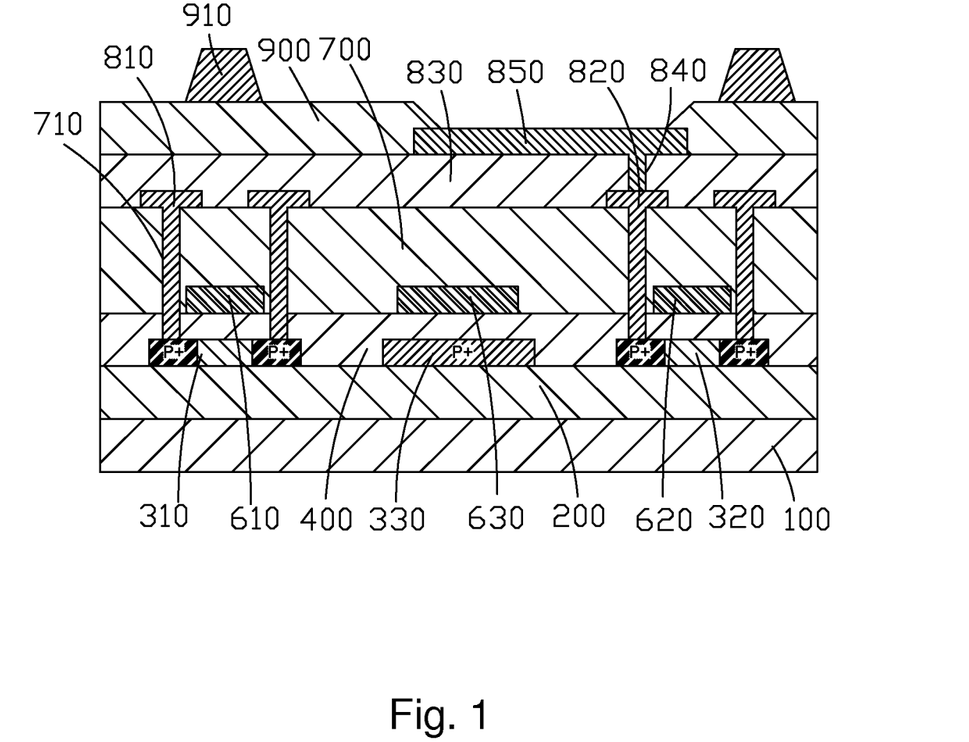
FIG. 1 is a cross-sectional view showing a conventional active matrix organic light emitting diode (AMOLED) backplane.

FIG. 1 is a cross-sectional view showing a conventional active matrix organic light emitting diode (AMOLED) backplane. A method for manufacturing the AMOLED backplane generally comprises the following steps:

Step 1: providing a substrate 100 and depositing a buffer layer 200 on the substrate 100;

Step 2: depositing an amorphous silicon layer on the buffer layer 200, conducting excimer laser annealing to crystallize and convert the amorphous silicon layer into a poly-silicon layer, and conducting a masking operation to subject the poly-silicon layer to patternization so as to form a first poly-silicon section 310, a second poly-silicon section 320, and a third poly-silicon section 330 that are spaced from each other;

Step 3: depositing a gate insulation layer 400 on the first poly-silicon section 310, the second poly-silicon section 320, the third poly-silicon section 330, and the buffer layer 200;

Step 4: depositing a first photoresist layer on the gate insulation layer 400 and conducting a masking operation to patternize the first photoresist layer;

wherein the first photoresist layer shields middle portions of the first poly-silicon section 310 and the second poly-silicon section 320 but does not shield the third poly-silicon section 330; and with the first photoresist layer serving as a shielding layer, P-type heavy doping is applied to the first poly-silicon section 310, the second poly-silicon section 320, and the third poly-silicon section 330 so as to form P-type heavily doped zones P+ respectively on two sides of each of the first poly-silicon section 310 and the second poly-silicon section 320 and the entirety of the third poly-silicon section 330;

Step 5: removing the first photoresist layer, depositing a first metal layer on the gate insulation layer 400, and conducting a masking operation to patternize the first metal layer so as to form a first gate terminal 610, a second gate terminal 620, and a metal electrode 630;

Step 6: depositing an interlayer insulation layer 700 on the first gate terminal 610, the second gate terminal 620, the metal electrode 630, and the gate insulation layer 400, and conducting a masking operation to form first vias 710 in the interlayer insulation layer 700 and the gate insulation layer 400 to respectively correspond to the P-type heavily doped zones P+ on the two sides of the first poly-silicon section 310 and those of the second poly-silicon section 320;

Step 7: depositing a second metal layer on the interlayer insulation layer 700 and conducting a masking operation to patternize the second metal layer so as to form first source/drain terminals 810 and second source/drain terminals 820;

wherein the first source/drain terminals 810 and the second source/drain terminals 820 are respectively connected through the first vias 710 to the P-type heavily doped zones P+ on the two sides of the first poly-silicon section 310 and those of the second poly-silicon section 320;

Step 8: forming a planarization layer 830 on the first source/drain terminals 810, the second source/drain terminals 820, and the interlayer insulation layer 700 and conducting a masking operation to form a second via 840 in the planarization layer 830 to correspond to the second source/drain terminals 820;

Step 9: depositing a conductive film on the planarization layer 830 and conducting a masking operation to patternize the conductive film so as to form an anode 850, wherein the anode 850 is connected through the second via 840 to the second source/drain terminals 820;

Step 10: depositing a second photoresist layer on the anode 850 and the planarization layer 830 and conducting a masking operation to patternize the second photoresist layer so as to form a pixel definition layer 900; and Step 11: depositing a third photoresist layer on the pixel definition layer 900 and the anode 850 and conducting a masking operation to patternize the third photoresist layer so as to form photo spacers 910.

The above-described process requires nine masks and thus, the process is complicated and has a low manufacturing efficiency and high cost. Further, excimer laser annealing may induce an issue of mura on a display device. Therefore, it is desired to provide a novel method for manufacturing an AMOLED backplane and a structure thereof in order to overcome the above problems.

SUMMARY OF THE INVENTION

An object of the present invention is to provide a method for manufacturing an active matrix organic light emitting diode (AMOLED) backplane, which has a simple process, reduces the number of masks used in the manufacturing process, increases the manufacturing efficiency, and saves costs and also eliminates the issue of mura occurring on a display device resulting from excimer laser annealing.

Another object of the present invention is to provide a structure of an AMOLED backplane, which has a simple structure, is easy to manufacture, and has a low cost.

To achieve the above objects, the present invention provides a method for manufacturing an AMOLED backplane, which comprises the following steps:

(1) providing a substrate, wherein the substrate comprises a TFT zone, a storage capacitor zone, and a drive TFT zone, depositing a first metal layer on the substrate, and conducting a masking operation to patternize the first metal layer so as to form a first gate terminal in the switch TFT zone, a second gate terminal in the drive TFT zone, and a metal electrode in the storage capacitor zone;

(2) depositing a gate insulation layer on the first gate terminal, the second gate terminal, and the first metal electrode;

(3) sequentially depositing an amorphous silicon layer and a P-type heavily doped amorphous silicon layer on the gate insulation layer, conducting a solid phase crystallization process to have the amorphous silicon layer and the P-type heavily doped amorphous silicon layer crystallized and respectively converted into a poly-silicon layer and a P-type heavily doped poly-silicon layer, and conducting a masking operation to simultaneously subject the poly-silicon layer and the P-type heavily doped poly-silicon layer to patternization so as to respectively form a first poly-silicon section and a second poly-silicon section above the first gate terminal and the second gate terminal;

(4) depositing a second metal layer on the first poly-silicon section, the second poly-silicon section, and the gate insulation layer and conducting a masking operation to patternize the second metal layer so as to form first source/drain terminals, second source/drain terminals, and a second metal electrode respectively above the first gate terminal, the second gate terminal, and the first metal electrode;

wherein the first source/drain terminals and the second source/drain terminals are respectively in contact with the P-type heavily doped poly-silicon layer of the first poly-silicon section and the second poly-silicon section; and then, with the first source/drain terminals and the second source/drain terminals serving as etch stop layers, the P-type heavily doped poly-silicon layer and a part of the poly-silicon layer that are located in channel sites of the first poly-silicon section and the second poly-silicon section are removed so as to form a first channel and a second channel that are formed in the poly-silicon layer and are respectively located in a middle portion of the first poly-silicon section and a middle portion of the second poly-silicon section;

(5) depositing a passivation layer on the first source/drain terminals, the second source/drain terminals, the second metal electrode, and the gate insulation layer;

(6) coating a planarization layer on the passivation layer and conducting a masking operation to form a via in the planarization layer and the passivation layer to correspond to the second source/drain terminals;

(7) depositing a conductive film on the planarization layer and conducting a masking operation to patternize the conductive film so as to form a pixel electrode layer, wherein the pixel electrode layer is connected through the via to the second source/drain terminals;

(8) coating a first organic photoresist layer on the pixel electrode layer and the planarization layer and conducting a masking operation to patternize the first organic photoresist layer so as to form a pixel definition layer; and (9) coating a second organic photoresist layer on the pixel definition layer and the pixel electrode layer and conducting a masking operation to patternize the second organic photoresist layer so as to form photo spacers;

wherein the first poly-silicon section, the first gate terminal, and the first source/drain terminals constitute a switch TFT; the second poly-silicon section, the second gate terminal, and the second source/drain terminals constitute a drive TFT; and the first metal electrode and the second metal electrode constitute a storage capacitor.

In step (1), the first gate terminal, the second gate terminal, and the first metal electrode comprise a material of molybdenum or copper.

In step (2), the gate insulation layer comprises a silicon oxide layer, a silicon nitride layer, or a composite structure composed of silicon oxide layers and silicon nitride layers.

In step (5), the passivation layer comprises a silicon oxide layer, a silicon nitride layer, or a composite structure composed of silicon oxide layers and silicon nitride layers.

In step (7), the conductive film, and thus the pixel electrode layer, is of a three-layer structure comprising a metal layer sandwiched between two conductive oxide layers, the conductive oxide layers comprising a material of indium tin oxide, the metal layer comprising a material of silver or aluminum.

The present invention also provides a structure of an AMOLED backplane, which comprises a substrate, a first gate terminal, a second gate terminal, and a first metal electrode formed on the substrate, a gate insulation layer formed on the first gate terminal, the second gate terminal, and the first metal electrode, a first poly-silicon section and a second poly-silicon section formed on the gate insulation layer, first source/drain terminals, second source/drain terminals, and a second metal electrode respectively formed on the first poly-silicon section, the second poly-silicon section, and the gate insulation layer, a passivation layer formed on the first source/drain terminals, the second source/drain terminals, the second metal electrode, and the gate insulation layer, a planarization layer formed on the passivation layer, a pixel electrode layer formed on the planarization layer, a pixel definition layer formed on the planarization layer and the pixel electrode layer, and photo spacers formed on the pixel definition layer;

wherein the first poly-silicon section and the second poly-silicon section both comprise a poly-silicon layer and a P-type heavily doped poly-silicon layer that are sequentially formed on the gate insulation layer; the first source/drain terminals and the second source/drain terminals are respectively in contact with the P-type heavily doped poly-silicon layer of the first poly-silicon section and the second poly-silicon section; the planarization layer and the passivation layer comprise a via formed therein to correspond to the second source/drain terminals; and the pixel electrode layer is connected through the via to the second source/drain terminals; and wherein the first poly-silicon section, the first gate terminal, and the first source/drain terminals constitute a switch TFT; the second poly-silicon section, the second gate terminal, and the second source/drain terminals constitute a drive TFT; and the first metal electrode and the second metal electrode constitute a storage capacitor.

The first gate terminal, the second gate terminal, and the first metal electrode comprise a material of molybdenum or copper.

The gate insulation layer comprises a silicon oxide layer, a silicon nitride layer, or a composite structure composed of silicon oxide layers and silicon nitride layers; and the passivation layer comprises a silicon oxide layer, a silicon nitride layer, or a composite structure composed of silicon oxide layers and silicon nitride layers.

The first poly-silicon section and the second poly-silicon section respectively comprise a first channel and a second channel that are formed in the poly-silicon layer and are respectively located in a middle portion of the first poly-silicon section and a middle portion of the second poly-silicon section.

The pixel electrode layer comprises a three-layer structure comprising a metal layer sandwiched between two conductive oxide layers, the conductive oxide layers comprising a material of indium tin oxide, the metal layer comprising a material of silver or aluminum.

The present invention further provides a structure of an AMOLED backplane, which comprises a substrate, a first gate terminal, a second gate terminal, and a first metal electrode formed on the substrate, a gate insulation layer formed on the first gate terminal, the second gate terminal, and the first metal electrode, a first poly-silicon section and a second poly-silicon section formed on the gate insulation layer, first source/drain terminals, second source/drain terminals, and a second metal electrode respectively formed on the first poly-silicon section, the second poly-silicon section, and the gate insulation layer, a passivation layer formed on the first source/drain terminals, the second source/drain terminals, the second metal electrode, and the gate insulation layer, a planarization layer formed on the passivation layer, a pixel electrode layer formed on the planarization layer, a pixel definition layer formed on the planarization layer and the pixel electrode layer, and photo spacers formed on the pixel definition layer;

wherein the first poly-silicon section and the second poly-silicon section both comprise a poly-silicon layer and a P-type heavily doped poly-silicon layer that are sequentially formed on the gate insulation layer; the first source/drain terminals and the second source/drain terminals are respectively in contact with the P-type heavily doped poly-silicon layer of the first poly-silicon section and the second poly-silicon section; the planarization layer and the passivation layer comprise a via formed therein to correspond to the second source/drain terminals; and the pixel electrode layer is connected through the via to the second source/drain terminals;

wherein the first poly-silicon section, the first gate terminal, and the first source/drain terminals constitute a switch TFT; the second poly-silicon section, the second gate terminal, and the second source/drain terminals constitute a drive TFT; and the first metal electrode and the second metal electrode constitute a storage capacitor;

wherein the first gate terminal, the second gate terminal, and the first metal electrode comprise a material of molybdenum or copper;

wherein the gate insulation layer comprises a silicon oxide layer, a silicon nitride layer, or a composite structure composed of silicon oxide layers and silicon nitride layers; and the passivation layer comprises a silicon oxide layer, a silicon nitride layer, or a composite structure composed of silicon oxide layers and silicon nitride layers;

wherein the first poly-silicon section and the second poly-silicon section respectively comprise a first channel and a second channel that are formed in the poly-silicon layer and are respectively located in a middle portion of the first poly-silicon section and a middle portion of the second poly-silicon section; and wherein the pixel electrode layer comprises a three-layer structure comprising a metal layer sandwiched between two conductive oxide layers, the conductive oxide layers comprising a material of indium tin oxide, the metal layer comprising a material of silver or aluminum.

The efficacy of the present invention is that the present invention provides a method for manufacturing an AMOLED backplane, which applies a solid phase crystallization process to crystallize and convert amorphous silicon into poly-silicon so as to prevent the issue of mura on a display device caused by excimer laser annealing and adopts a back channel etching structure to effectively reduce the number of masks used. The method for manufacturing the AMOLED backplane according to the present invention needs only seven masking operations and, compared to the prior art, saves two masking operations, thereby simplifying the manufacturing process, improving the manufacturing efficiency, and saving costs. The present invention provides a structure of an AMOLED backplane, which applies a solid phase crystallization process to crystallize and convert amorphous silicon into poly-silicon so as to prevent the issue of mura on a display device caused by excimer laser annealing and adopts a back channel etching structure so as to have a simple structure, being easy to manufacture, and having a low cost.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 2:
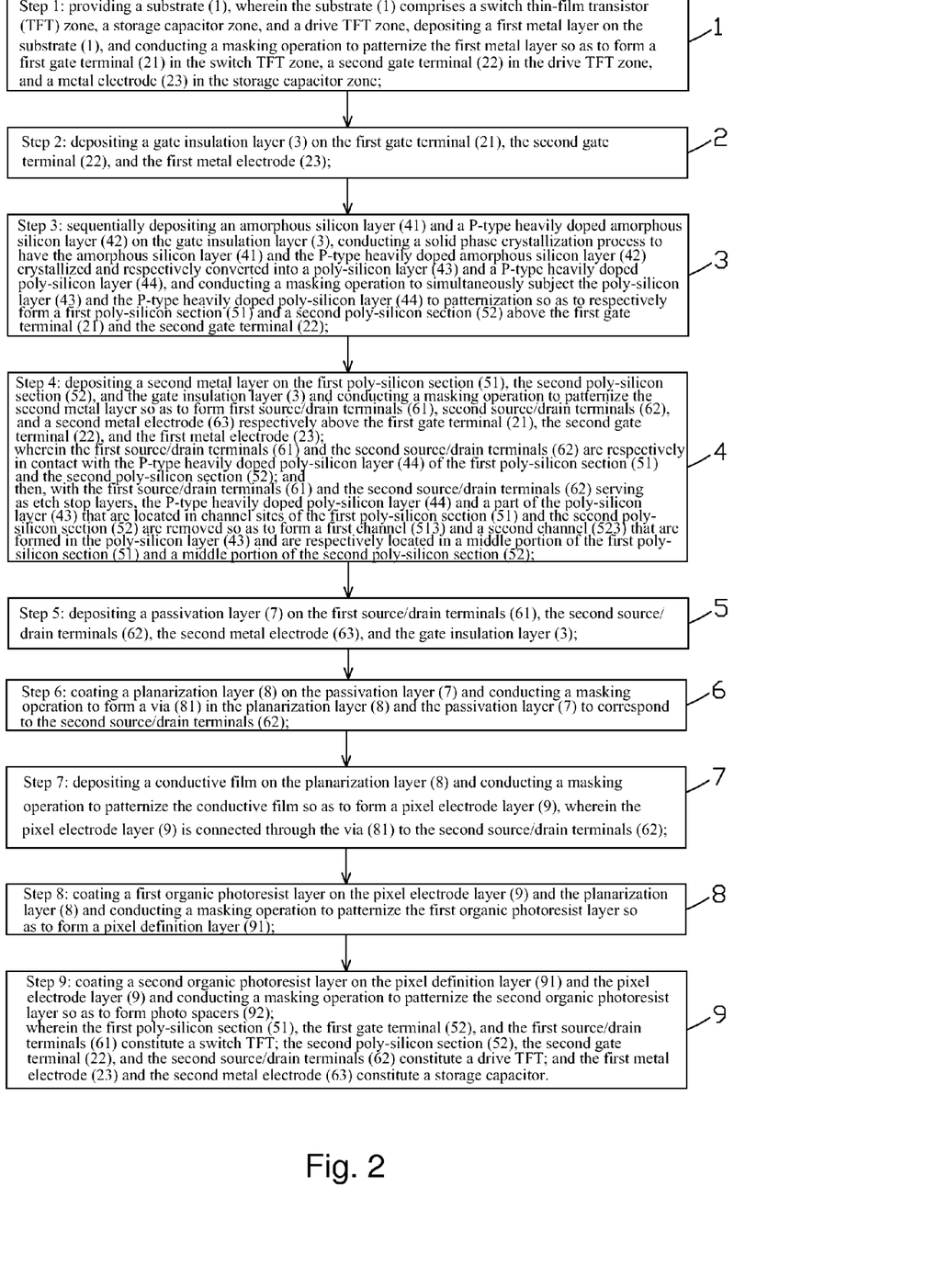
FIG. 2 is a flow chart illustrating a method for manufacturing an AMOLED backplane according to the present invention.
Figure 3:
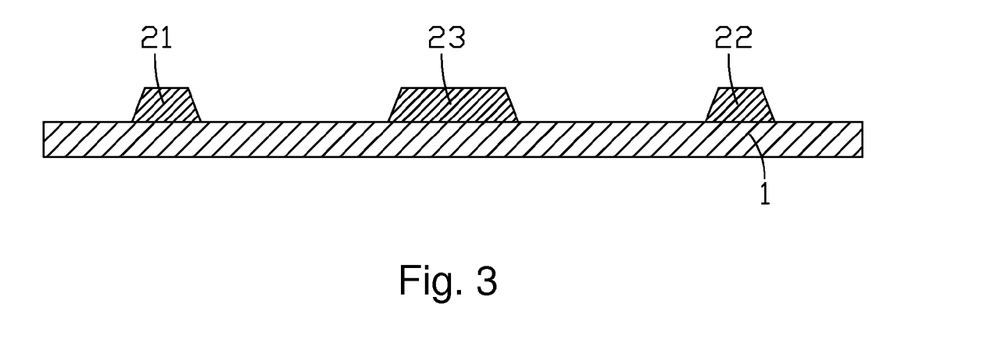
FIG. 3 is a schematic view illustrating a first step of the method for manufacturing the AMOLED backplane according to the present invention.

Referring to FIG. 2, the present invention provides a method for manufacturing an active matrix organic light emitting diode (AMOLED) backplane, which comprises the following steps:

Step 1: as shown in FIG. 3, providing a substrate 1, wherein the substrate 1 comprises a switch thin-film transistor (TFT) zone, a storage capacitor zone, and a drive TFT zone, depositing a first metal layer on the substrate 1, and conducting a masking operation to patternize the first metal layer so as to form a first gate terminal 21 in the switch TFT zone, a second gate terminal 22 in the drive TFT zone, and a metal electrode 23 in the storage capacitor zone.

Specifically, the first gate terminal 21, the second gate terminal 22, and the first metal electrode 23 comprise a material of molybdenum (Mo) or copper (Cu).

Figure 4:
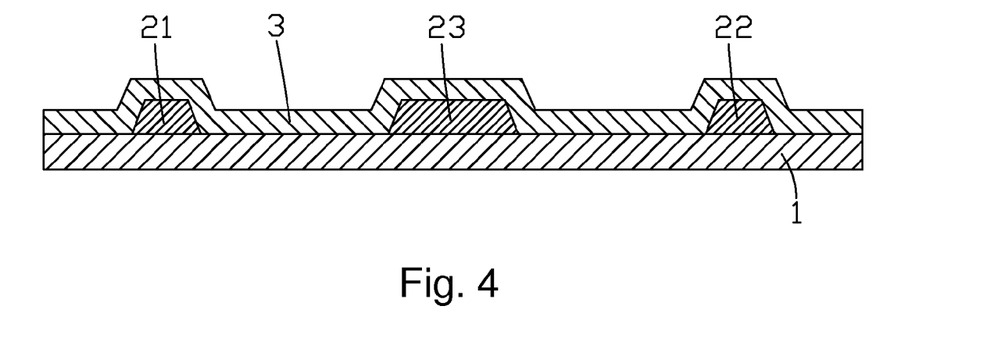
FIG. 4 is a schematic view illustrating a second step of the method for manufacturing the AMOLED backplane according to the present invention.

Step 2: as shown in FIG. 4, depositing a gate insulation layer 3 on the first gate terminal 21, the second gate terminal 22, and the first metal electrode 23.

Specifically, the gate insulation layer 3 comprises a material of silicon oxide (SiOx), silicon nitride (SiNx), or a combination thereof.

Figure 5:
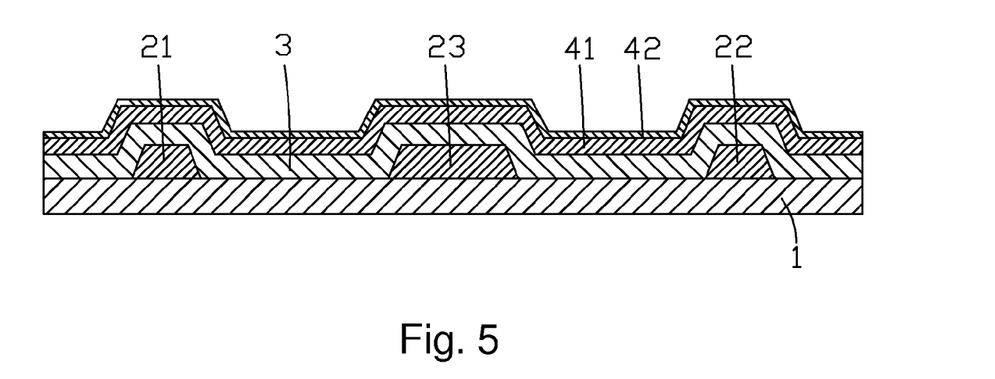
FIGS. 5-7 are schematic views illustrating a third step of the method for manufacturing the AMOLED backplane according to the present invention.
Figure 6:
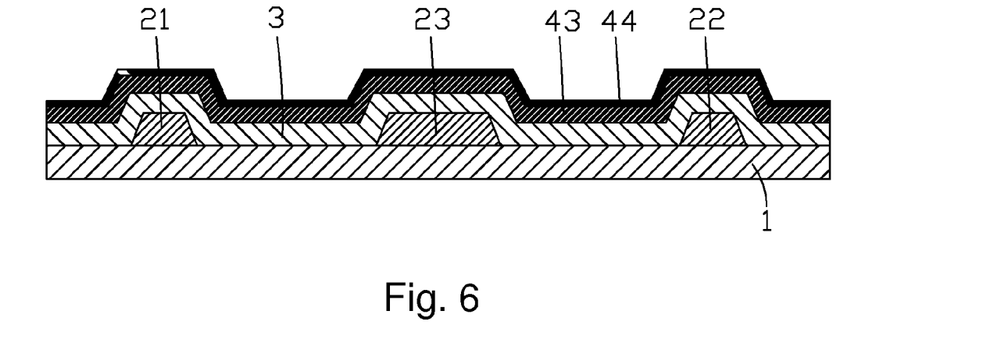
Figure 7:
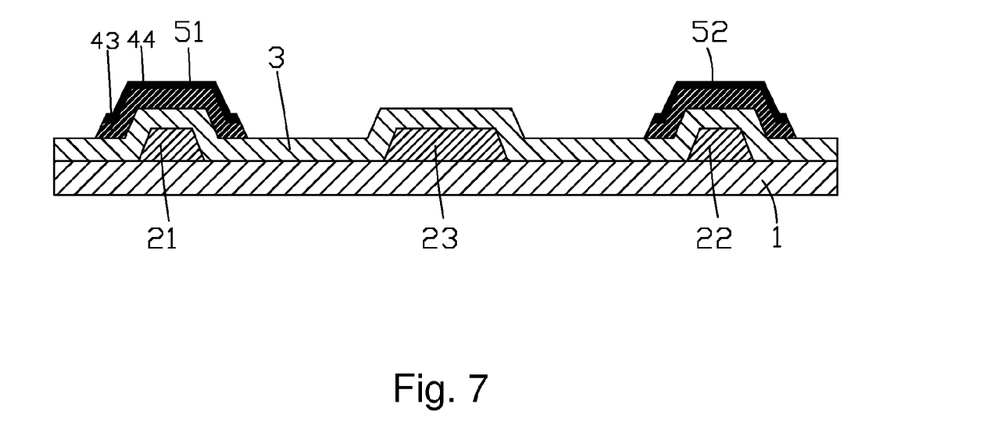

Step 3: as shown in FIGS. 5-7, sequentially depositing an amorphous silicon layer 41 and a P-type heavily doped amorphous silicon layer 42 on the gate insulation layer 3, conducting a solid phase crystallization process to have the amorphous silicon layer 41 and the P-type heavily doped amorphous silicon layer 42 crystallized and respectively converted into a poly-silicon layer 43 and a P-type heavily doped poly-silicon layer 44, and conducting a masking operation to simultaneously subject the poly-silicon layer 43 and the P-type heavily doped poly-silicon layer 44 to patternization so as to respectively form a first poly-silicon section 51 and a second poly-silicon section 52 above the first gate terminal 21 and the second gate terminal 22.

Using a solid phase crystallization process to crystallize and convert the amorphous silicon into poly-silicon can prevent the issue of mura occurring on a display device caused by excimer laser annealing (ELA).

Figure 8:
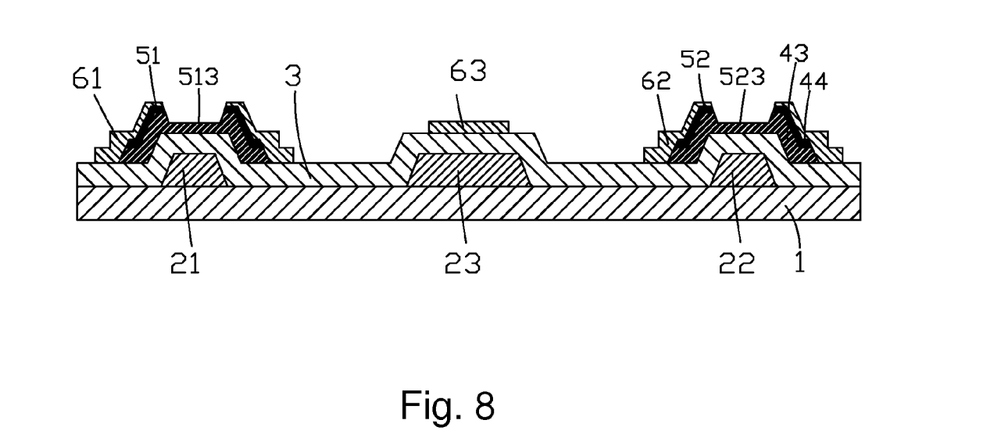
FIG. 8 is a schematic view illustrating a fourth step of the method for manufacturing the AMOLED backplane according to the present invention.

Step 4: as shown in FIG. 8, depositing a second metal layer on the first poly-silicon section 51, the second poly-silicon section 52, and the gate insulation layer 3 and conducting a masking operation to patternize the second metal layer so as to form first source/drain terminals 61, second source/drain terminals 62, and a second metal electrode 63 respectively above the first gate terminal 21, the second gate terminal 22, and the first metal electrode 23, wherein the first source/drain terminals 61 and the second source/drain terminals 62 are respectively in contact with the P-type heavily doped poly-silicon layer 44 of the first poly-silicon section 51 and the second poly-silicon section 52; and then, with the first source/drain terminals 61 and the second source/drain terminals 62 serving as etch stop layers, the P-type heavily doped poly-silicon layer 44 and a part of the poly-silicon layer 43 that are located in channel sites of the first poly-silicon section 51 and the second poly-silicon section 52 are removed so as to form a first channel 513 and a second channel 523 that are formed in the poly-silicon layer 43 and are respectively located in a middle portion of the first poly-silicon section 51 and a middle portion of the second poly-silicon section 52.

Figure 9:
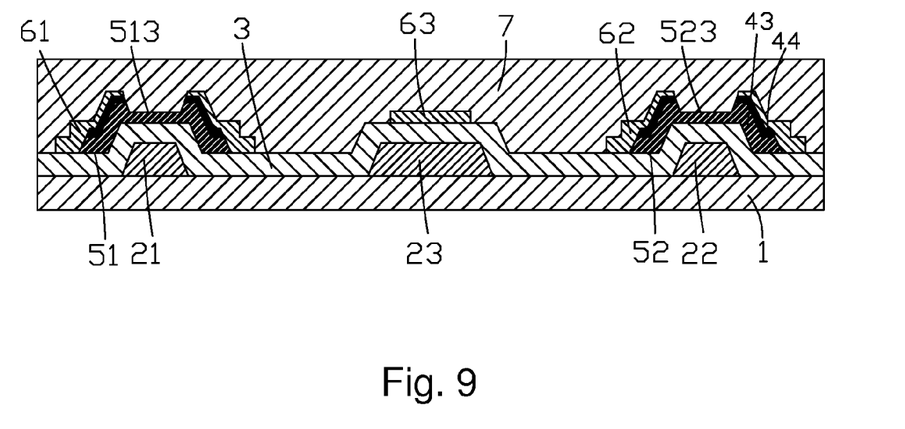
FIG. 9 is a schematic view illustrating a fifth step of the method for manufacturing the AMOLED backplane according to the present invention.

Step 5: as shown in FIG. 9, depositing a passivation layer 7 on the first source/drain terminals 61, the second source/drain terminals 62, the second metal electrode 63, and the gate insulation layer 3.

Specifically, the passivation layer 7 comprises a silicon oxide layer, a silicon nitride layer, or a composite structure composed of silicon oxide layers and silicon nitride layers.

Figure 10:
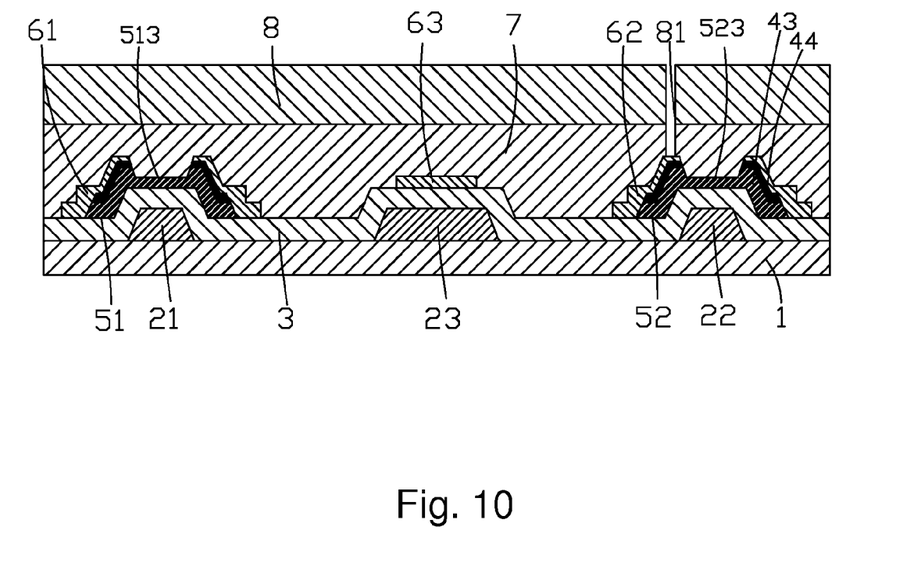
FIG. 10 is a schematic view illustrating a sixth step of the method for manufacturing the AMOLED backplane according to the present invention.

Step 6: as shown in FIG. 10, coating a planarization layer 8 on the passivation layer 7 and conducting a masking operation to form a via 81 in the planarization layer 8 and the passivation layer 7 to correspond to the second source/drain terminals 62.

Figure 11:
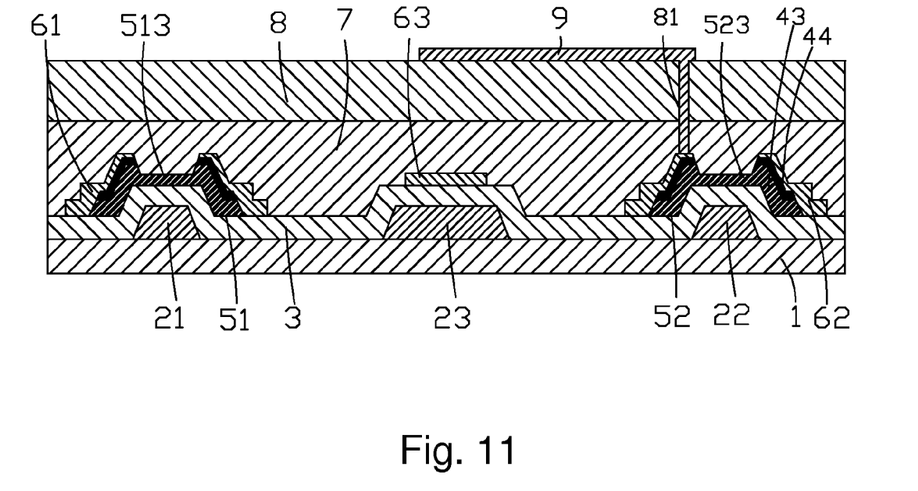
FIG. 11 is a schematic view illustrating a seventh step of the method for manufacturing the AMOLED backplane according to the present invention.

Step 7: as shown in FIG. 11, depositing a conductive film on the planarization layer 8 and conducting a masking operation to patternize the conductive film so as to form a pixel electrode layer 9, wherein the pixel electrode layer 9 is connected through the via 81 to the second source/drain terminals 62.

Specifically, the conductive film, namely the pixel electrode layer 9, is of a three-layer structure comprising a metal layer sandwiched between two conductive oxide layers; and preferably, the conductive oxide layers comprise a material of indium tin oxide (ITO) and the metal layer comprises a material of silver (Ag) or aluminum (Al).

Figure 12:
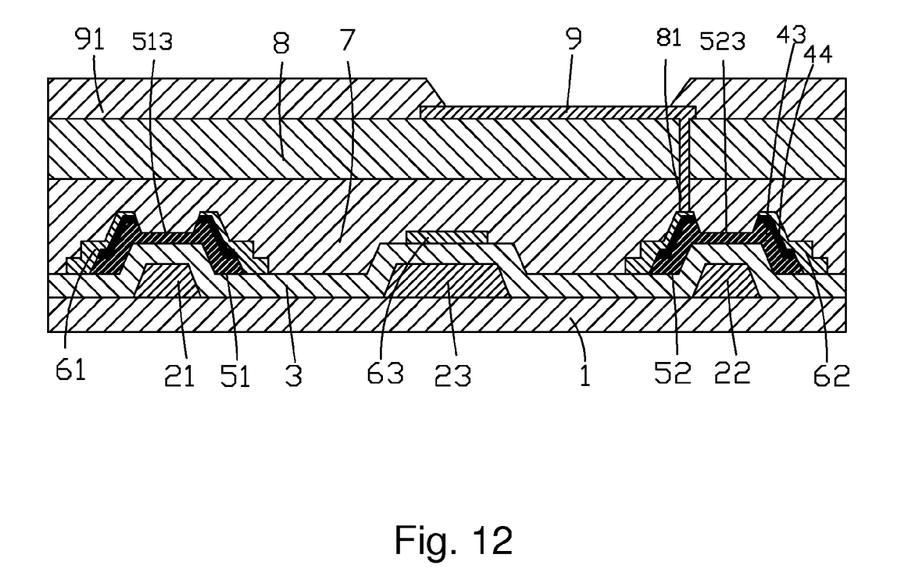
FIG. 12 is a schematic view illustrating an eighth step of the method for manufacturing the AMOLED backplane according to the present invention.

Step 8: as shown in FIG. 12, coating a first organic photoresist layer on the pixel electrode layer 9 and the planarization layer 8 and conducting a masking operation to patternize the first organic photoresist layer so as to form a pixel definition layer 91.

Figure 13:
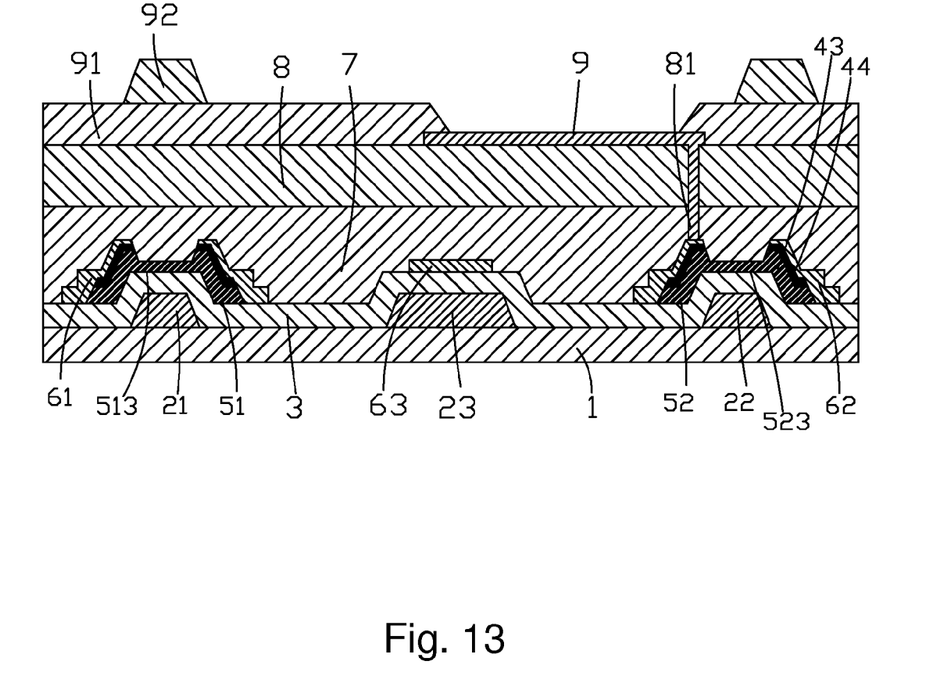
FIG. 13 is a schematic view illustrating a ninth step of the method for manufacturing the AMOLED backplane according to the present invention and also presents a cross-sectional view of the structure of the AMOLED backplane according to the present invention.

Step 9: as shown in FIG. 13, coating a second organic photoresist layer on the pixel definition layer 91 and the pixel electrode layer 9 and conducting a masking operation to patternize the second organic photoresist layer so as to form photo spacers 92.

Specifically, the first poly-silicon section 51, the first gate terminal 52, and the first source/drain terminals 61 constitute a switch TFT; the second poly-silicon section 52, the second gate terminal 22, and the second source/drain terminals 62 constitute a drive TFT; and the first metal electrode 23 and the second metal electrode 63 constitute a storage capacitor.

The above-described method for manufacturing an AMOLED backplane applies a solid phase crystallization process to crystallize and convert amorphous silicon into poly-silicon and prevents the issue of mura caused by excimer laser annealing and adopts a back channel etching structure to effectively reduce the number of masks used, simplify the manufacturing process, improve the manufacturing efficiency, and reduce cost.

Referring to FIG. 10, the present invention also provides a structure of an AMOLED backplane, which comprises substrate 1, a first gate terminal 21, a second gate terminal 22, and a first metal electrode 23 formed on the substrate 1, a gate insulation layer 3 formed on the first gate terminal 21, the second gate terminal 22, and the first metal electrode 23, a first poly-silicon section 51 and a second poly-silicon section 52 formed on the gate insulation layer 3, first source/drain terminals 61, second source/drain terminals 62, and a second metal electrode 63 respectively formed on the first poly-silicon section 51, the second poly-silicon section 52, and the gate insulation layer 3, a passivation layer 7 formed on the first source/drain terminals 61, the second source/drain terminals 62, the second metal electrode 63, and the gate insulation layer 3, a planarization layer 8 formed on the passivation layer 7, a pixel electrode layer 9 formed on the planarization layer 8, a pixel definition layer 91 formed on the planarization layer 8 and the pixel electrode layer 9, and photo spacers 92 formed on the pixel definition layer 91.

The first poly-silicon section 51 and the second poly-silicon section 52 both comprise a poly-silicon layer 43 and a P-type heavily doped poly-silicon layer 44 that are sequentially formed on the gate insulation layer 3. The first source/drain terminals 61 and the second source/drain terminals 62 are respectively in contact with the P-type heavily doped poly-silicon layer 44 of the first poly-silicon section 51 and the second poly-silicon section 52. The planarization layer 8 and the passivation layer 7 comprise a via 81 formed therein to correspond to the second source/drain terminals 62. The pixel electrode layer 9 is connected through the via 81 to the second source/drain terminals 62.

Specifically, the first poly-silicon section 51 and the second poly-silicon section 52 respectively comprise a first channel 513 and a second channel 523 that are formed in the poly-silicon layer 43 and are respectively located in a middle portion of the first poly-silicon section 51 and a middle portion of the second poly-silicon section 52.

Specifically, the pixel electrode layer 9 has a three-layer structure comprising a metal layer sandwiched between two conductive oxide layers. The conductive oxide layers comprise a material of indium tin oxide. The metal layer comprises a material of silver or aluminum.

Specifically, the first gate terminal 21, the second gate terminal 22, and the first metal electrode 23 comprise a material of molybdenum or copper.

Specifically, the gate insulation layer 3 comprises a silicon oxide layer, a silicon nitride layer, or a composite structure composed of silicon oxide layers and silicon nitride layers.

Specifically, the passivation layer 7 comprises a silicon oxide layer, a silicon nitride layer, or a composite structure composed of silicon oxide layers and silicon nitride layers.

The above-described structure of an AMOLED backplane applies a solid phase crystallization process to crystallize and convert amorphous silicon into poly-silicon so as to prevent the issue of mura caused by excimer laser annealing and adopts a back channel etching structure so as to have a simple structure, being easy to manufacture, and having a low cost.

In summary, the present invention provides a method for manufacturing an AMOLED backplane, which applies a solid phase crystallization process to crystallize and convert amorphous silicon into poly-silicon so as to prevent the issue of mura caused by excimer laser annealing and adopts a back channel etching structure to effectively reduce the number of masks used. The method for manufacturing the AMOLED backplane according to the present invention needs only seven masking operations and, compared to the prior art, saves two masking operations, thereby simplifying the manufacturing process, improving the manufacturing efficiency, and saving costs. The present invention provides a structure of an AMOLED backplane, which applies a solid phase crystallization process to crystallize and convert amorphous silicon into poly-silicon so as to prevent the issue of mura caused by excimer laser annealing and adopts a back channel etching structure so as to have a simple structure, being easy to manufacture, and having a low cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an active matrix organic light emitting diode (AMOLED) backplane, comprising the following steps:
    (1) providing a substrate, wherein the substrate comprises a switch thin-film transistor (TFT) zone, a storage capacitor zone, and a drive TFT zone, depositing a first metal layer on the substrate, and conducting a masking operation to patternize the first metal layer so as to form a first gate terminal in the switch TFT zone, a second gate terminal in the drive TFT zone, and a metal electrode in the storage capacitor zone;
    (2) depositing a gate insulation layer on the first gate terminal, the second gate terminal, and the first metal electrode;
    (3) sequentially depositing an amorphous silicon layer and a P-type heavily doped amorphous silicon layer on the gate insulation layer, conducting a solid phase crystallization process to have the amorphous silicon layer and the P-type heavily doped amorphous silicon layer crystallized and respectively converted into a poly-silicon layer and a P-type heavily doped poly-silicon layer, and conducting a masking operation to simultaneously subject the poly-silicon layer and the P-type heavily doped poly-silicon layer to patternization so as to respectively form a first poly-silicon section and a second poly-silicon section above the first gate terminal and the second gate terminal;
    (4) depositing a second metal layer on the first poly-silicon section, the second poly-silicon section, and the gate insulation layer and conducting a masking operation to patternize the second metal layer so as to form first source/drain terminals, second source/drain terminals, and a second metal electrode respectively above the first gate terminal, the second gate terminal, and the first metal electrode;
    wherein the first source/drain terminals and the second source/drain terminals are respectively in contact with the P-type heavily doped poly-silicon layer of the first poly-silicon section and the second poly-silicon section; and
    then, with the first source/drain terminals and the second source/drain terminals serving as etch stop layers, the P-type heavily doped poly-silicon layer and a part of the poly-silicon layer that are located in channel sites of the first poly-silicon section and the second poly-silicon section are removed so as to form a first channel and a second channel that are formed in the poly-silicon layer and are respectively located in a middle portion of the first poly-silicon section and a middle portion of the second poly-silicon section;
    (5) depositing a passivation layer on the first source/drain terminals, the second source/drain terminals, the second metal electrode, and the gate insulation layer;
    (6) coating a planarization layer on the passivation layer and conducting a masking operation to form a via in the planarization layer and the passivation layer to correspond to the second source/drain terminals;
    (7) depositing a conductive film on the planarization layer and conducting a masking operation to patternize the conductive film so as to form a pixel electrode layer, wherein the pixel electrode layer is connected through the via to the second source/drain terminals;
    (8) coating a first organic photoresist layer on the pixel electrode layer and the planarization layer and conducting a masking operation to patternize the first organic photoresist layer so as to form a pixel definition layer; and
    (9) coating a second organic photoresist layer on the pixel definition layer and the pixel electrode layer and conducting a masking operation to patternize the second organic photoresist layer so as to form photo spacers;
    wherein the first poly-silicon section, the first gate terminal, and the first source/drain terminals constitute a switch TFT; the second poly-silicon section, the second gate terminal, and the second source/drain terminals constitute a drive TFT; and the first metal electrode and the second metal electrode constitute a storage capacitor.

2. The method for manufacturing the AMOLED backplane as claimed in claim 1, wherein in step (1), the first gate terminal, the second gate terminal, and the first metal electrode comprise a material of molybdenum or copper.

3. The method for manufacturing the AMOLED backplane as claimed in claim 1, wherein in step (2), the gate insulation layer comprises a silicon oxide layer, a silicon nitride layer, or a composite structure composed of silicon oxide layers and silicon nitride layers.

4. The method for manufacturing the AMOLED backplane as claimed in claim 1, wherein in step (5), the passivation layer comprises a silicon oxide layer, a silicon nitride layer, or a composite structure composed of silicon oxide layers and silicon nitride layers.

5. The method for manufacturing the AMOLED backplane as claimed in claim 1, wherein in step (7), the conductive film, and thus the pixel electrode layer, is of a three-layer structure comprising a metal layer sandwiched between two conductive oxide layers, the conductive oxide layers comprising a material of indium tin oxide, the metal layer comprising a material of silver or aluminum.

6. A structure of an active matrix organic light emitting diode (AMOLED) backplane, comprising a substrate, a first gate terminal, a second gate terminal, and a first metal electrode formed on the substrate, a gate insulation layer formed on the first gate terminal, the second gate terminal, and the first metal electrode, a first poly-silicon section and a second poly-silicon section formed on the gate insulation layer, first source/drain terminals, second source/drain terminals, and a second metal electrode respectively formed on the first poly-silicon section, the second poly-silicon section, and the gate insulation layer, a passivation layer formed on the first source/drain terminals, the second source/drain terminals, the second metal electrode, and the gate insulation layer, a planarization layer formed on the passivation layer, a pixel electrode layer formed on the planarization layer, a pixel definition layer formed on the planarization layer and the pixel electrode layer, and photo spacers formed on the pixel definition layer;
  wherein the first poly-silicon section and the second poly-silicon section both comprise a poly-silicon layer and a P-type heavily doped poly-silicon layer that are sequentially formed on the gate insulation layer; the first source/drain terminals and the second source/drain terminals are respectively in contact with the P-type heavily doped poly-silicon layer of the first poly-silicon section and the second poly-silicon section; the planarization layer and the passivation layer comprise a via formed therein to correspond to the second source/drain terminals; and the pixel electrode layer is connected through the via to the second source/drain terminals; and
  wherein the first poly-silicon section, the first gate terminal, and the first source/drain terminals constitute a switch TFT; the second poly-silicon section, the second gate terminal, and the second source/drain terminals constitute a drive TFT; and the first metal electrode and the second metal electrode constitute a storage capacitor.

7. The structure of the AMOLED backplane as claimed in claim 6, wherein the first gate terminal, the second gate terminal, and the first metal electrode comprise a material of molybdenum or copper.

8. The structure of the AMOLED backplane as claimed in claim 6, wherein the gate insulation layer comprises a silicon oxide layer, a silicon nitride layer, or a composite structure composed of silicon oxide layers and silicon nitride layers; and the passivation layer comprises a silicon oxide layer, a silicon nitride layer, or a composite structure composed of silicon oxide layers and silicon nitride layers.

9. The structure of the AMOLED backplane as claimed in claim 6, wherein the first poly-silicon section and the second poly-silicon section respectively comprise a first channel and a second channel that are formed in the poly-silicon layer and are respectively located in a middle portion of the first poly-silicon section and a middle portion of the second poly-silicon section.

10. The structure of the AMOLED backplane as claimed in claim 6, wherein the pixel electrode layer comprises a three-layer structure comprising a metal layer sandwiched between two conductive oxide layers, the conductive oxide layers comprising a material of indium tin oxide, the metal layer comprising a material of silver or aluminum.

11. A structure of an active matrix organic light emitting diode (AMOLED) backplane, comprising a substrate, a first gate terminal, a second gate terminal, and a first metal electrode formed on the substrate, a gate insulation layer formed on the first gate terminal, the second gate terminal, and the first metal electrode, a first poly-silicon section and a second poly-silicon section formed on the gate insulation layer, first source/drain terminals, second source/drain terminals, and a second metal electrode respectively formed on the first poly-silicon section, the second poly-silicon section, and the gate insulation layer, a passivation layer formed on the first source/drain terminals, the second source/drain terminals, the second metal electrode, and the gate insulation layer, a planarization layer formed on the passivation layer, a pixel electrode layer formed on the planarization layer, a pixel definition layer formed on the planarization layer and the pixel electrode layer, and photo spacers formed on the pixel definition layer;
  wherein the first poly-silicon section and the second poly-silicon section both comprise a poly-silicon layer and a P-type heavily doped poly-silicon layer that are sequentially formed on the gate insulation layer; the first source/drain terminals and the second source/drain terminals are respectively in contact with the P-type heavily doped poly-silicon layer of the first poly-silicon section and the second poly-silicon section; the planarization layer and the passivation layer comprise a via formed therein to correspond to the second source/drain terminals; and the pixel electrode layer is connected through the via to the second source/drain terminals;
  wherein the first poly-silicon section, the first gate terminal, and the first source/drain terminals constitute a switch TFT; the second poly-silicon section, the second gate terminal, and the second source/drain terminals constitute a drive TFT; and the first metal electrode and the second metal electrode constitute a storage capacitor;
  wherein the first gate terminal, the second gate terminal, and the first metal electrode comprise a material of molybdenum or copper;
  wherein the gate insulation layer comprises a silicon oxide layer, a silicon nitride layer, or a composite structure composed of silicon oxide layers and silicon nitride layers; and the passivation layer comprises a silicon oxide layer, a silicon nitride layer, or a composite structure composed of silicon oxide layers and silicon nitride layers;

wherein the first poly-silicon section and the second poly-silicon section respectively comprise a first channel and a second channel that are formed in the poly-silicon layer and are respectively located in a middle portion of the first poly-silicon section and a middle portion of the second poly-silicon section; and wherein the pixel electrode layer comprises a three-layer structure comprising a metal layer sandwiched between two conductive oxide layers, the conductive oxide layers comprising a material of indium tin oxide, the metal layer comprising a material of silver or aluminum.

* * * * *